(12) United States Patent
Edo (10) Patent No.: US 6,805,748 B1
(45) Date of Patent: Oct. 19, 2004

(54) SUBSTRATE PROCESSING SYSTEM WITH LOAD-LOCK CHAMBER

(75) Inventor: Ryo Edo, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/691,068

(22) Filed: Oct. 19, 2000

(30) Foreign Application Priority Data

Oct. 19, 1999 (JP) .......................................... 11-296094

(51) Int. Cl.[7] .......................... C23C 16/00; H05H 1/00; H01L 21/00
(52) U.S. Cl. .................... 118/719; 118/66; 156/345.31; 156/345.32; 438/716
(58) Field of Search .......................... 118/719, 66, 715, 118/695, 702, 500; 156/345.31–345.32; 438/716

(56) References Cited

U.S. PATENT DOCUMENTS

| | | | |
|---|---|---|---|
| 4,975,168 A | 12/1990 | Ohno et al. ............ 204/192.13 |
| 5,044,314 A | 9/1991 | McNeilly ..................... 118/715 |
| 5,436,202 A | 7/1995 | Miura ......................... 437/209 |
| 5,489,339 A | 2/1996 | Hattori et al. .......... 118/723 R |
| 5,611,655 A | 3/1997 | Fukasawa et al. ........... 414/217 |
| 5,837,059 A | * 11/1998 | Glants ........................ 118/733 |
| 5,906,680 A | 5/1999 | Meyerson .................... 117/88 |
| 5,943,230 A | * 8/1999 | Rinnen et al. ................ 700/18 |
| 6,086,952 A | 7/2000 | Lang et al. ............ 427/255.29 |
| 6,110,232 A | * 8/2000 | Chen et al. ................. 29/25.01 |
| 6,211,081 B1 | 4/2001 | Mikata ........................ 438/680 |
| 6,275,744 B1 | 8/2001 | Yoshida ....................... 700/218 |
| 6,468,384 B1 | 10/2002 | Singh et al. ............ 156/345.27 |
| 6,508,062 B2 | 1/2003 | Flanigan ........................ 62/3.2 |
| 6,672,864 B2 | 1/2004 | Wang et al. .................... 432/5 |
| 6,707,533 B2 | 3/2004 | Mishima ....................... 355/53 |

FOREIGN PATENT DOCUMENTS

| | | | | |
|---|---|---|---|---|
| JP | 4-277025 A | * 10/1992 | ............. B01J/3/00 |
| JP | 10-50789 A | * 2/1998 | .......... H01L/21/68 |
| WO | WO-99/22403 | * 5/1999 | ......... H01L/21/306 |

* cited by examiner

*Primary Examiner*—Parviz Hassanzadeh
(74) *Attorney, Agent, or Firm*—Fitzpatrick, Cella, Harper & Scinto (57) ABSTRACT

A substrate processing system includes a process chamber having a process station for processing a substrate in an ambience different from an atmosphere, a plurality of load-lock chambers each being connected to the process chamber through an opening/closing device and connected to the atmosphere through an opening/closing device, a first conveying device for conveying the substrate between the process chamber and the load-lock chambers, and a second conveying device for conveying the substrate between a supply station in the atmosphere and the load-lock chambers. Each of the load-lock chambers is arranged so that, prior to replacement of an ambience inside the load-lock chamber, the substrate is conveyed by the first conveying device from the load-lock chamber into the process chamber and then the substrate is conveyed into the load-lock chamber.

6 Claims, 8 Drawing Sheets

SUBSTRATE PROCESSING SYSTEM WITH LOAD-LOCK CHAMBER

FIELD OF THE INVENTION AND RELATED ART

This invention relates to a substrate processing system and/or a substrate conveying method, usable in a semiconductor device or liquid crystal display panel manufacturing process, for example, to convey a substrate to be processed (such as a semiconductor wafer or a liquid crystal display substrate, for example) to a process chamber to process the same therein.

In exposure apparatuses for transferring in very fine pattern such as a circuit pattern onto a substrate such as a semiconductor wafer or a liquid crystal display substrate, further reduction in linewidth of a transferred pattern as well as further increase of throughput have been desired. The narrowing of the linewidth of a transferred pattern requires shortening of the wavelength of exposure light to be used for exposure (photoprinting), and the wavelength shortening is made by using g-line, i-line and then a KrF laser, for example. Among these light sources, X-rays to be emitted from a synchrotron ring are considered to be a short wavelength light source suitable for transferring a very fine pattern. Here, since such X-rays are much attenuated in atmosphere, usually, an exposure unit of an exposure apparatus is accommodated in a chamber while the chamber inside space is filled with a reduced pressure of He ambience, less attenuating X-rays, and the exposure process is performed therein.

In such exposure apparatuses, a substrate to be processed such as a Si wafer, for example, should be conveyed between an exposure process unit inside a chamber and a substrate supply unit in an atmosphere. To this end, a load-lock chamber is provided between them, such that each substrate is conveyed through the load-lock chamber.

Figure 3:
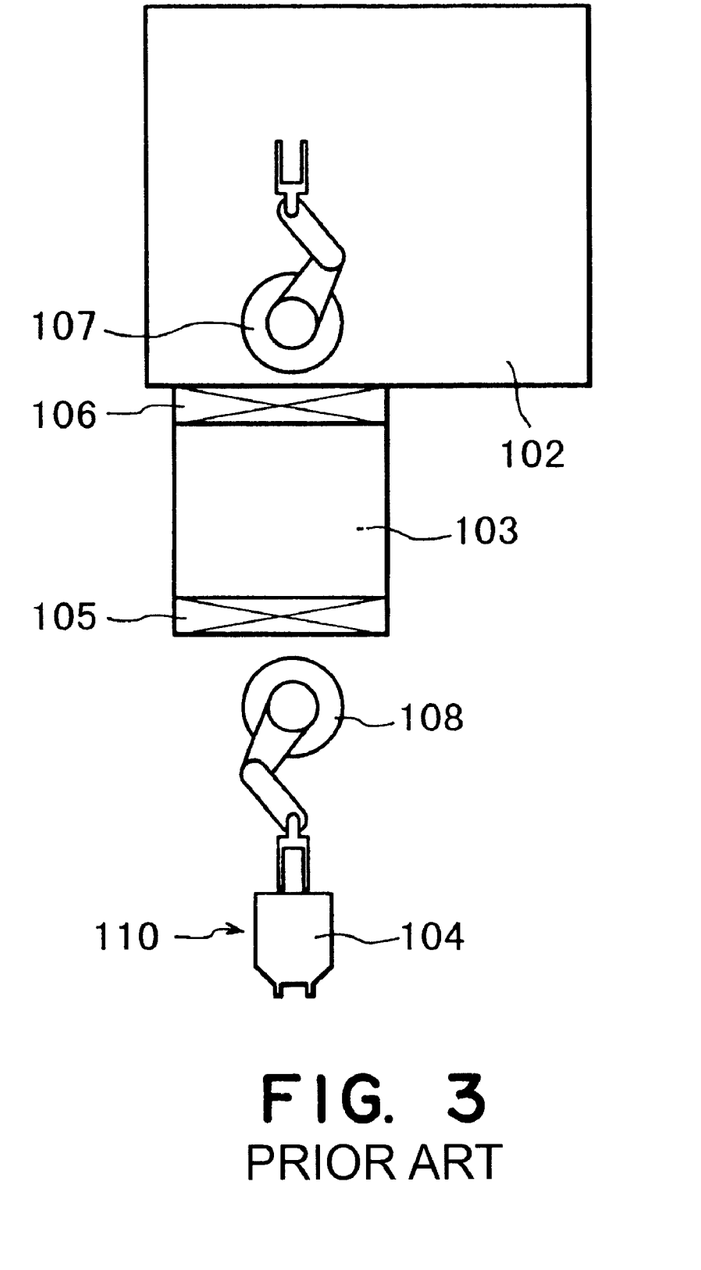
FIG. 3 is a schematic view of a conventional wafer processing system.

FIG. 3 shows a general structure of a known type wafer processing system with a load-lock chamber wherein one or more wafers can be accommodated.

As shown in FIG. 3, this type of wafer processing system comprises a chamber 102 for accommodating therein a process station where a process such as an exposure process to a wafer, for example, is to be performed in an ambience different from the atmosphere, as well as a load-lock chamber 103 and a wafer supply station 110 which is disposed in the atmosphere. The load-lock chamber 103 is provided with an atmosphere side gate valve 105 for isolating the load-lock chamber 103 from the wafer supply station 110 in the atmosphere, and a chamber side gate valve 106 for isolating the load-lock chamber 103 from the chamber 102. Further, the load-lock chamber 103 is provided with a gas discharging means (not shown) for discharging a gas out of the chamber, and gas supply means (not shown) for supplying a gas of He or $N_2$ into the chamber. Also, there is a table (not shown) on which a wafer is to be placed. Inside the chamber 102, there is conveying means 107 for conveying a wafer between the load-lock chamber 103 and the process station. Also, there is conveying means 108 for conveying a wafer between the wafer supply station 110 in the atmosphere and the load-lock chamber 103.

In operation of the load-lock chamber 103, when the atmosphere side gate valve 105 is kept opened and one or more wafers are supplied into the chamber from a wafer carrier 104 which is placed at the wafer supply station 110 in the atmosphere, the atmosphere side gate valve 105 is closed and then ambience replacement is carried out by using the gas discharging means and the gas supplying means. Thereafter, as an ambience the same as the inside ambience of the chamber 102 is established inside the load-lock chamber 103, the chamber side gate valve 106 is opened, such that, by the conveying means 107 inside the chamber 102, a wafer or wafers inside the load-lock chamber 103 are taken out and conveyed to the process station. After a predetermined process is made to the wafer at the process station, the wafer is moved back to the load-lock chamber 103 by the conveying means 107. Then, through the load-lock chamber 103, the wafer is conveyed back to the water carrier 104. Thereafter, through repetition of similar operations, conveyances and processes of wafers are made sequentially.

As regards the conveyance sequence of this wafer processing system, the wafer supply to the process station where an exposure process or the like is made and the wafer collection from the process station are made in parallel to each other. More specifically, there is a temporary wafer storage space before the process station. After a process is completed, a processed wafer at the process station is temporarily collected to the temporary storage space. Then, promptly after a wafer to be processed next is conveyed to the process station, the processed wafer at the temporary storage space is conveyed to the load-lock chamber. The processed wafer inside the load-lock chamber is moved out of the chamber and is collected to the wafer carrier at the wafer supply station in the atmosphere. Promptly after it, a subsequent wafer is conveyed into the load-lock chamber, and the ambience replacement is carried out.

Figure 4:
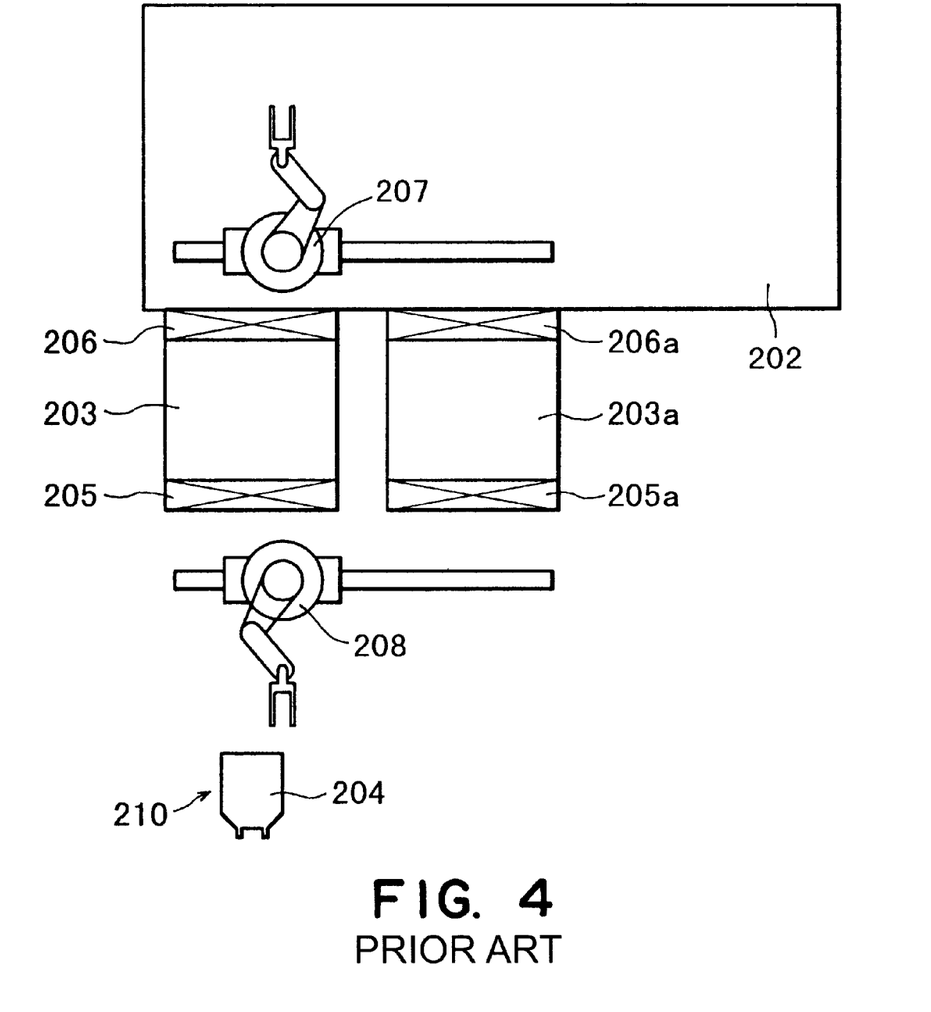
FIG. 4 is a schematic view of another example of a conventional water processing system.

FIG. 4 shows another type of wafer processing system having a sending-in load-lock chamber and a sending-out load-lock chamber separately. In FIG. 4, the wafer processing unit comprises a chamber 202 for accommodating therein a process station for processing a wafer in an ambience different from the atmosphere, a sending-in load-lock chamber 203, a sending-out load-lock chamber 203a, and a wafer supply station 210 which is disposed in the atmosphere. The load-lock chambers 203 and 203a are provided with atmosphere side gate valves 205 and 205a for isolating the load-lock chambers from the wafer supply station 210 in the atmosphere, as well as chamber side gate valves 206 and 206a for isolating them from the chamber 202. Further, the load-lock chambers 203 and 203a are provided with gas discharging means (not shown) for discharging a gas from the load-lock chambers, and gas supplying means (not shown) for supplying a gas of He or $N_2$ into these chambers. Furthermore, the load-lock chambers 203 and 203a are provided with a table (not shown) on which a wafer carrier for accommodating plural wafers (e.g., 25 wafers) therein is to be placed. Inside the chamber 202, there is conveying means 207 for conveying wafers between the process station and the load-lock chambers 203 and 203a. Another conveying means 208 is provided to convey a wafer carrier 24 between the wafer supply station 210 in the atmosphere and the load-lock chambers 203 and 203a.

In such a wafer processing system, a wafer carrier 204 having plural wafers accommodated therein is conveyed from the wafer supply station 210 into the sending-in load-lock chamber 203 by use of the conveying means 208 or by an operator, and then it is placed on the table inside the load-lock chamber 203. At this moment, the atmosphere side gate valve 205 of the load-lock chamber 203 is open to the atmosphere. After the wafer carrier 204 is conveyed into the load-lock chamber 203, the gate valve 205 is closed and replacement of the inside ambience of the load-lock chamber 203 is carried out. As an ambience the same as the inside ambience of the chamber 202 is established inside the load-lock chamber 203, the chamber side gate valve 206 is opened, such that, by the conveying means 207 inside the chamber 202, a wafer or wafers inside the load-lock chamber 203 are taken out and conveyed to the process station inside the chamber 202. After a predetermined process is made to the wafer at the process station, the wafer is conveyed to the sending-out load-lock chamber 203a by the conveying means 207. Here, the wafer carrier 204 has been set in the sending-out load-lock chamber 203a, and also an ambience the same as the inside ambience of the chamber 202 has been set inside the load-lock chamber 203a. After wafers of a predetermined number are processed and they are accommodated into the wafer carrier 204 inside the load-lock chamber 203a, the chamber side gate valve 206a is closed. Then, replacement of the inside ambience of the load-lock chamber 203a is carried out and, after it, the atmosphere side gate valve 205a is opened. Thereafter, the wafer carrier 204 is conveyed to the wafer supply station 210 by use of the conveying means 208 or by the separator.

A wafer processing system of a further example comprises plural load-lock chambers, and a wafer carrier placement station is provided in an atmosphere. Conveying means which is accessible to the wafer carrier placement station and the load-lock chambers is disposed in the atmosphere. By using this conveying means, wafers are taken out of a wafer carrier at the wafer carrier placement station, and they are conveyed to the load-lock chambers.

In exposure apparatuses, as described hereinbefore, a further reduction in printed linewidth as well as a further improvement of throughput are required. As regards the requirement of higher throughput, in X-ray exposure apparatuses, the exposure process time can be shortened well. However, in substrate supplying and conveying systems for supplying and conveying substrates such as wafers. The time for replacement of an ambience gas in a load-lock chamber raises a problem. More specifically, in the load-lock chamber, it is necessary to perform an operation for replacement of an atmosphere and a reduced pressure He ambience gas should be done. There is a limit to shortening the time for the ambience replacement.

Further, in order to improve the throughput, the wafer conveyance time and the load-lock chamber ambience replacement time should be made shorter than the wafer process time. However, where bi-directional conveyance (i.e., sending a wafer into and out of a reduced pressure He ambience) is considered, the wafer conveyance time including the load-lock chamber ambience replacement is a bar to the improvement of the throughput.

Namely, the total time corresponding to the sum of (i) the time necessary for the load-lock chamber ambience replacement from the atmosphere to a reduced pressure He ambience and then from the reduced pressure He ambience to the atmosphere and (ii) the time necessary for the wafer conveyance, must be shorter than the wafer exposure process time. If the load-lock chamber ambience replacement time cannot be shortened physically, the throughput cannot be improved. Even in a case wherein the wafer conveyance is quick, if the load-lock chamber ambience replacement time is longer, a wafer must be stopped before the load-lock chamber until the ambience replacement is completed. This is very inefficient with respect to the throughput.

Figure 5:
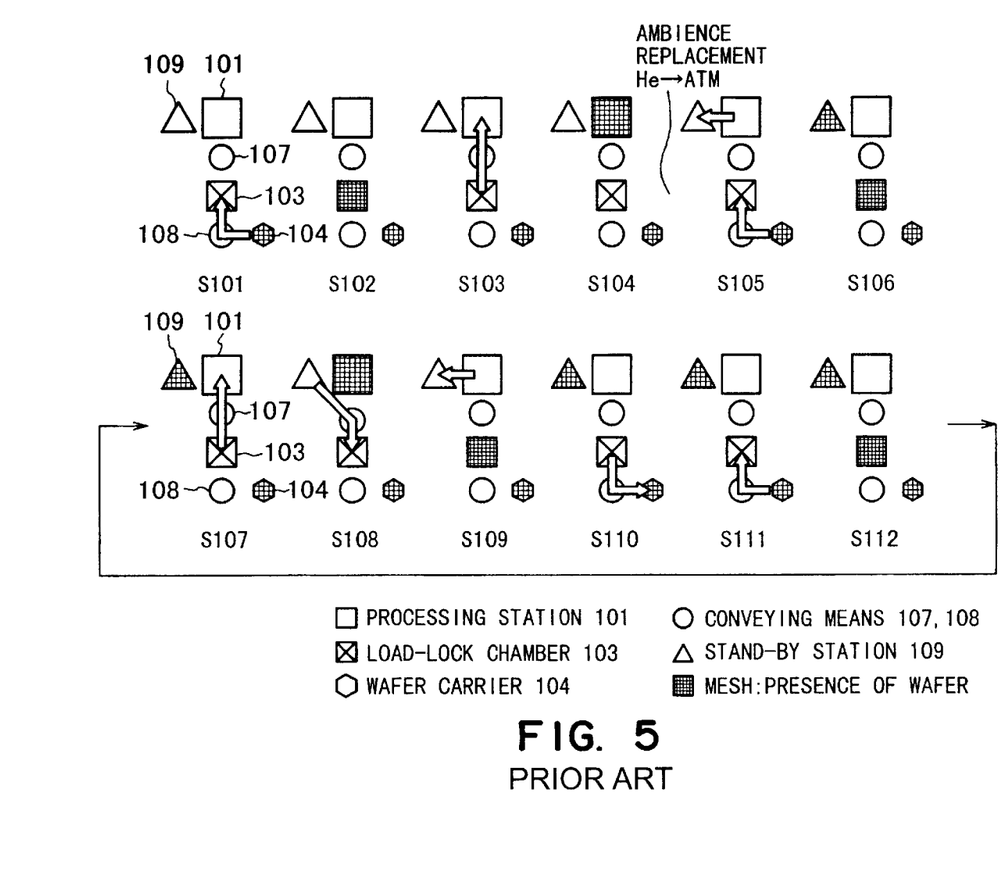
FIG. 5 is a schematic view for explaining a wafer conveyance sequence in the wafer processing system of FIG. 3.

For example, the wafer conveyance sequence through the load-lock chamber in the wafer processing system shown in FIG. 3 may be done in the manner as illustrated in FIG. 5.

In FIG. 5. denoted at 101 is the exposure station inside the chamber 102, and denoted at 103 is the load-lock chamber. Denoted at 104 is the wafer carrier disposed at the supply station in the atmosphere. Denoted at 107 and 108 are conveying means inside the chamber and conveying means in the atmosphere, respectively. Denoted at 109 is a standby station where a wafer to which an exposure process is completed is temporarily held. Arrows in the drawing depict the state of wafer conveyance or wafer transfer. Mesh portions each illustrates the place where a wafer is present. When a wafer is present inside the load-lock chamber 103, it means that the ambience replacement from a reduced pressure He gas to the atmosphere or from the atmosphere to the reduced pressure He ambience has been accomplished inside the load-lock chamber.

At step S101, a wafer stored in the wafer carrier 104 is taken out of the carrier by the conveying means 108, and it is conveyed toward the load-lock chamber 103. At this moment, the load-lock chamber 103 is open to the atmosphere. At step S102, the wafer is moved into the load-lock chamber 103, and the ambience replacement from the atmosphere to the reduced pressure He gas is carried out therein. At step S103, the wafer inside the load-lock chamber 103 is conveyed onto the exposure station 101 by the conveying means 107. At step S104, an exposure process to the wafer is carried out at the exposure station 101. At this time, in the load-lock chamber 103, the ambience replacement from the reduced pressure He gas to the atmosphere is carried out.

Subsequently, at step S510, the wafer having been exposed at the exposure station 101 is transferred from the exposure station 101 to the stand-by station 109. Simultaneously therewith, a second wafer to be processed next is taken out of the wafer carrier 104 by the conveying means 108, and it is conveyed to the load-lock chamber 103. At step S106, the wafer to which the exposure process has been completed is present at the stand-by station, while the second wafer is present in the load-lock chamber 103. In the load-lock chamber 103, ambience replacement from the atmosphere to a reduced pressure He gas is carried out. At step S107, the second wafer inside the load-lock chamber 103 is conveyed to the exposure station 101 by the conveying means 107. At step S108, an exposure process to the second wafer is carried out at the exposure station 101. Simultaneously therewith, the already exposed wafer which is present at the stand-by station 109 is collected into the load-lock ch mber 103 by the conveying means 107.

Subsequently, at step S109, the wafer having been exposed at the exposure station 101 is transferred to the stand-by station. There is a wafer in the load-lock chamber 103, and the ambience replacement from the reduced pressure He gas to the atmosphere is carried out in the load-lock chamber 103. Thereafter, at step S110, while the exposed wafer is kept at the stand-by station 109, the wafer inside the load-lock chamber 103 is collected into the wafer carrier 104 by the conveying means 108. Subsequently, at step S111, a third wafer stored in the wafer carrier 104 is taken Out by the conveying means 108, and it is conveyed to the load-lock chamber 103. At step S112, in the load-lock chamber 103 wherein the third wafer is present, the ambience replacement from the atmosphere to a reduced pressure He gas is carried out. During this time period, the already exposed wafer is held at the stand-by station 109.

Thereafter, similarly to step S107, the third wafer in the load-lock chamber 103 is conveyed to the exposure station 101 by the conveying means 107 and. at step S108, an exposure process is performed to the third wafer at the exposure station 101. Simultaneously therewith, the already exposed wafer held at the stand-by position 109 is collected into the load-lock chamber 103 by the conveying means 107. After this, the operations at steps S107–S112 are repeated to perform exposure processes to wafers of a predetermined number.

In the wafer conveyance sequence in such a wafer processing system, the total time of the wafer conveyance time plus the time for ambience replacement of the load-lock chamber is longer than the time necessary for the exposure process. As a result, like at steps S110–S112, there is a useless time in which no exposure process is performed at the exposure station.

This state can be expressed by equations, as follows. Now, the time for ambience replacement in the load-lock chamber from the reduced pressure He ambience to atmosphere is denoted by $T_{h \to a}$, the time for replacement form the atmosphere to reduced pressure He ambience is denoted by $T_{a \to h}$, the wafer conveyance time is denoted by $T_{tr}$, and the wafer process time at the exposure station, including the exposure time, is denoted by $T_{ex}$. Here, if the relation $$T_{ex} \geq T_{h \to a} + T_{a \to h} + T_{tr}$$

is not satisfied, the wafer conveyance time or the load-lock chamber ambience replacement time raises a problem with respect to enlargement of the throughput.

Further, in the wafer processing system such as shown in FIG. 4 wherein there are separate sending-in and sending-out load-lock chambers, while the wafer conveyance into and from the reduced pressure He ambience is taken into account, a relation $$T_{ex}/2 \geq T_{h \to a} + T_{a \to h} + T_{tr}$$

should be satisfied. Thus, the requirement to the wafer conveyance time and the load-lock chamber ambience replacement time is very strict.

Figure 6:
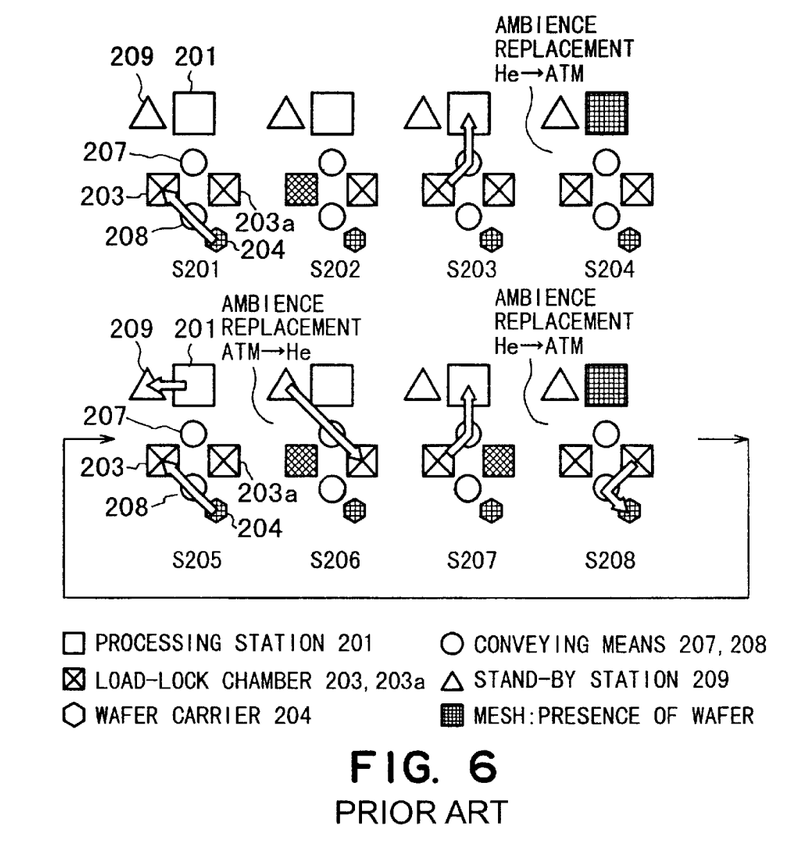
FIG. 6 is a schematic view for explaining a wafer conveyance sequence in the wafer processing system of FIG. 4.

In the wafer processing system of FIG. 4, the wafer conveyance sequence with plural load-lock chambers may be done such as shown in FIG. 6.

In FIG. 6, denoted at 201 is the exposure station inside the chamber 202, and denoted at 203 is the sending-in load-lock chamber. Denoted at 204 is the wafer carrier disposed at the supply station in the atmosphere. Denoted at 207 and 208 are conveying means inside the chamber and conveying means in the atmosphere, respectively. Denoted at 209 is a stand-by station where a wafer to which an exposure process is completed is temporarily held. Arrows in the drawing depict the state of wafer conveyance or wafer transfer. Mesh portions each illustrates the place where a wafer is present. When a wafer is present inside the load-lock chamber 203 or 203a, it means that the ambience replacement from a reduced pressure He gas to the atmosphere or from the atmosphere to the reduced pressure He ambience has been accomplished inside that load-lock chamber.

At step S201, a wafer stored in the wafer carrier 204 is taken out of the carrier by the conveying means 208, and it is conveyed toward the sending-in load-lock chamber 203. At this moment, the load-lock chamber 203 is open to the atmosphere. At step S202, in the load-lock chamber 103 having a wafer conveyed therein, the ambience replacement from the atmosphere to the reduced pressure He gas is carried out. At step S203, the wafer inside the load-lock chamber 203 is conveyed to the exposure station 201 by the conveying means 207. At step S204, an exposure process to the wafer is carried out at the exposure station 201. At this time, in the load-lock chamber 203, the ambience replacement from the reduced pressure He gas to the atmosphere is carried out.

Subsequently, at step S205, the wafer having been exposed at the exposure station 201 is transferred from the exposure station 201 to the stand-by station 209. Simultaneously therewith, a second wafer to be processed next is taken out of the wafer carrier 204 by the conveying means 208, and it is conveyed to the sending-in load-lock chamber 203 having been replaced by an atmosphere ambience. At this moment, in the sending-out load-lock chamber 203a, the ambience replacement from the atmosphere to a reduced pressure He gas is carried out. At step S206, the wafer at the stand-by station 209 to which the exposure process has been completed is conveyed by the conveying means 207 to the load-lock chamber 203a having a reduced pressure He ambience. At the same time, in the load-lock chamber 203, ambience replacement from the reduced pressure He ambience to the atmosphere is carried out. Then, at step S207, the second wafer inside the sending-in load-lock chamber 203 is conveyed to the exposure station 201 by load-lock chamber 203a, the ambience replacement from the reduced pressure He to the atmosphere is carried out. At step S208, an exposure process to the second wafer is carried out at the exposure station 201. Simultaneously therewith, the already exposed wafer is conveyed by the conveying means 208 from the sending-out load-lock chamber 203a to the wafer carrier 204. Also, in the sending-in load-lock chamber 203, ambience replacement from the reduced pressure He gas to the atmosphere is carried out. Subsequently, like step S205, the wafer having been exposed at the exposure station 201 is transferred to the stand-by station 209, and a next wafer is taken out from the wafer carrier 204 by the conveying means 208, and the wafer is conveyed to the sending-in load-lock chamber 203 having been replaced by an atmosphere ambience. Then, the operations at steps S205–S208 are repeated to wafers of a predetermined unit.

When plural load-lock chambers are used such as described above, the useless time in which no exposure process is carried out at the exposure station can be reduced. However, there is still a useless time at step S206.

Such useless time in which no exposure process is carried out at the station is attributable to the total time of the wafer conveyance time plus the load-lock chamber ambience replacement time being longer than the exposure process time. However, it is very difficult to shorten these time periods. For, the wafer conveyance time $T_{tr}$ includes time for taking a wafer out of the wafer carrier, time for conveying the wafer out of the load-lock chamber and conveying it to the exposure station, as well as time for wafer rough alignment to be done during the conveyance. Taking the time necessary for such wafer transfer or wafer rough alignment into account, practically it is very difficult to shorten the wafer conveyance time $T_{tr}$ by very much.

Also, as regards the time necessary for vacuum evacuation in the ambience replacement time $T_{h \to a}$ or $T_{a \to h}$, it is determined by the gas discharging rate of an evacuation vacuum pump, the discharge-to-pressure characteristic of the pump, the volume of the load-lock chamber and the conductance of a pipe that communicates the load-lock chamber with the vacuum pump. There is a limit to making the load-lock chamber volume small, relative to the wafer size. Also, in order to shorten the evacuation time, the gas discharging rate of the pump must be made extraordinarily large. This is not practicable Further, in order to shorten the wafer conveyance time, a wafer carrier may be provided in a load-lock chamber. However, it is contradictory to reduction of vacuum evacuation time and, practically, the throughput is slowed down.

As described above, in the wafer processing system and the wafer conveyance sequence, there are inconveniences to be solved to meet requirements of increases in the throughput.

SUMMARY OF THE INVENTION

It is an object of the present invention to provide a substrate processing system and/or a substrate conveying method wherein a plurality of load-lock chambers are used and wherein the total conveyance time is shortened thereby to increase the throughput.

In accordance with an aspect of the present invention, there is provided a substrate processing system, comprising: a process chamber having a process station for processing a substrate in an ambience different from an atmosphere; a plurality of load-lock chambers each being connected to said process clamber and to the atmosphere through an opening/closing device; first conveying means disposed in said process chamber, for conveying the substrate between said process chamber and said load-lock chambers; and second conveying means disposed in the atmosphere, for conveying the substrate between a supply station in the atmosphere and said load-lock chambers; wherein each of said load-lock chambers is arranged both for sending-in and sending-out of the substrate, and wherein, in each load-lock chamber, ambience replacement is carried out after the substrate is sent into or out of the load-lock chamber.

The process chamber may be provided with a stand-by station adjacent to said process station, for temporarily holding the substrate having been processed.

The first conveying means may convey the substrate between said process station, said load-lock chambers, and said stand-by station.

When there is no substrate at said process station, said first conveying means may convey it substrate from one of said load-lock chambers to said process station, and to convey a substrate, having been processed and being placed at said stand-by station, to one of said load-lock chambers from which the substrate has just been conveyed to said process station.

In accordance with another aspect of the present invention, there is provided a substrate conveying method in a substrate processing system including (i) a process chamber having a process station for processing a substrate in an ambience different from an atmosphere, (ii) a plurality of load-lock chambers each being connected to the process chamber and to the atmosphere through an opening/closing device, (iii) first conveying means disposed in the process chamber, for conveying the substrate between the process chamber and the load-lock chambers, and (iv) second conveying means disposed in the atmosphere, for conveying the substrate between a supply station in the atmosphere and the load-lock chambers, the substrate conveying method being for conveying a substrate between the supply station and the process chamber through the load-lock chambers, wherein plural substrates are sequentially supplied from the supply station to the load-lock chambers, and wherein, in each of the load-lock chambers, ambience replacement is carried out after both sending-in and sending-out of a substrate are performed.

The process chamber may be provided with a stand-by station adjacent to the process station, for temporarily holding the substrate having been processed.

The first conveying means may convey t)he substrate between the process station, the load-lock chambers, and the stand-by station, and, when there is no substrate at the process station, the first conveying means may convey a substrate from one of the load-lock chambers to the process station, and to convey a substrate, having been processed and being placed at the stand-by station, to one of the load-lock chambers from which the substrate has just been conveyed to the process station.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Preferred embodiments of the present invention will now be described with reference to the accompanying drawings.

Figure 1:
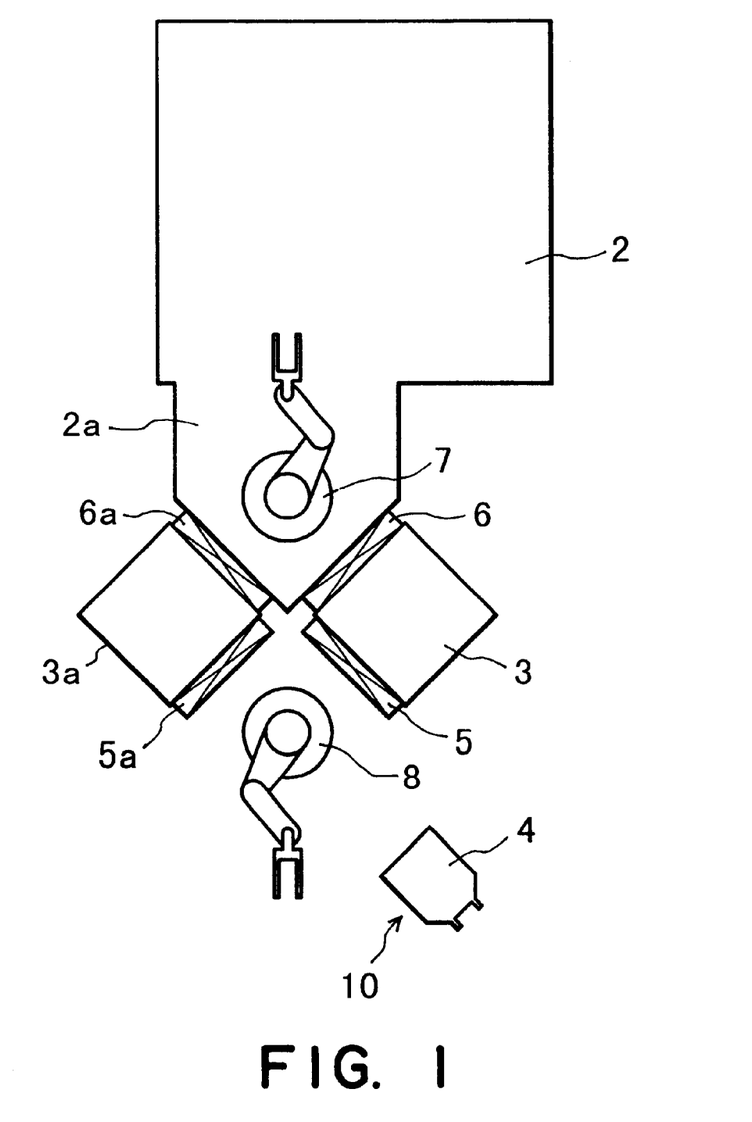
FIG. 1 is a schematic view of a general structure of a substrate processing system according to an embodiment of the present invention.
Figure 2:
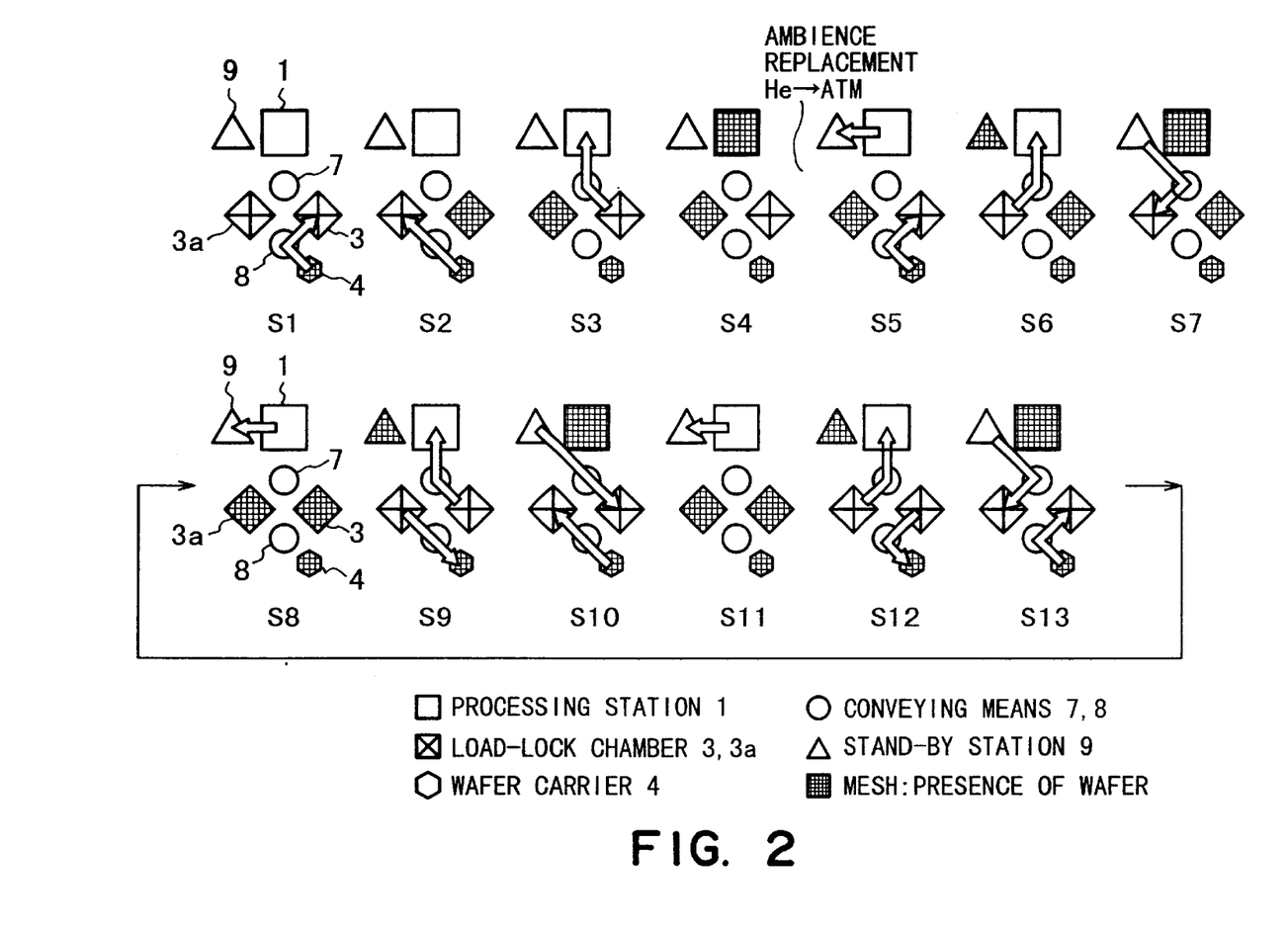
FIG. 2 is a schematic view for explaining a substrate conveyance sequence in a substrate processing system according to the present invention

FIG. 1 is a schematic view of a general structure of a substrate processing system according an embodiment of the present invention. FIG. 2 as a schematic view for explaining a substrate conveyance sequence In a substrate processing system according to the present invention.

The substrate processing system shown in FIG. 1 comprises a chamber 2 having a process station defined therein, for performing a process such as an exposure process to a substrate (wafer). A reduced pressure He ambience is maintained inside the chamber 2. The processing system further comprises a wafer supply station 10 which is disposed in an atmosphere and on which a wafer carrier 4 is to be placed The chamber 2 is provided with an auxiliary chamber 2a having inside conveying means 7.

The process station inside the chamber 2 for performing a process such as an exposure process, for example, is provided with holding means for holding a wafer. This holding means is arranged for transfer of a wafer between it and the inside conveying means 7 disposed in the chamber 2. Further, there is a wafer stand-by station (not shown) adjacent the process station, so that a wafer to which a process such as an exposure process is completed is kept at the wafer stand-by station until the same is conveyed out of the chamber 2. The wafer stand-by station has a function for transferring a wafer between it and the holding means of the process station. Also, it can be accessed by the chamber inside conveying means 7.

Disposed between the chamber 2 and the wafer supply station 10 in the atmosphere are two load-lock chambers 3 and 3a for transferring a wafer between different ambiences. The load-lock chambers 3 and 3a are communicated with the atmosphere through atmosphere side gate valves 5 and 5a, respectively. Also, they are communicated with the auxiliary chamber 2a through chamber side gate valves 6 and 6a, respectively.

At the atmosphere side, there is conveying means 8 for conveying a wafer between a wafer carrier 4, to be placed on the wafer supply station 10, and the load-lock chambers 3 and 3a. This conveying means 8 is arranged to access the load-lock chambers 3 and 3a as well as the wafer carrier 4 on the wafer supply station 10. In the example as illustrated, the two load-lock chambers 3 and 3a and the wafer carrier 4 are disposed approximately along a circumference around the conveying means 8, and the conveying means 8 uses a scalar robot.

The auxiliary chamber 2a for connecting the chamber 2 with the load-lock chambers 3 and 3a includes the inside conveying means 7 for conveying a wafer between the process station and the load-lock chambers 3 and 3a. This chamber inside conveying means 7 is arranged to access the two load-lock chambers 3 and 3a and the process station, respectively. In the illustrated example, the two load-lock chambers 3 and 3a and the process station are disposed approximately along a circumference around the conveying means 7 which comprises a scalar robot.

While not shown in the drawing, each of the load-lock chambers 3 and 3a is provided with vacuum evacuation (gas discharging) means, gas introducing means for supplying He or $N_2$ gas, pressure monitoring means, and so on. Further, the load-lock chambers 3 and 3a as well as the conveying means 7 and 8 are arranged to operate in parallel to process or convey wafers The inside volume of each load-lock chamber 3 or 3a is made smallest to minimize the time necessary for evacuation.

A substrate conveyance sequence in a substrate processing system according to the present invention will be explained, in accordance with the flow of a wafer.

When a wafer is to be introduced into the chamber, the conveying means 8 moves its arm into the wafer carrier 4 placed at the wafer supply station 10, to pick up one wafer accommodated in the water carrier 4. Then, the arm grasping the wafer is retracted. The conveying means 8 checks the ambience inside the load-lock chamber 3 or 3a. If, at this time, the load-lock chamber 3 is filled with an atmospheric ambience, the conveying means 8 rotates its arm toward the load-lock chamber 3. After checking that the atmosphere side gate valve 5 is in its open position, the conveying means 8 extends its arm so that the wafer is loaded into the load-lock chamber 3. After the wafer is transferred into the load-lock chamber 3, the conveying means 8 retracts its arm, and it moves backwardly.

Thereafter, the atmosphere side gate valve 5 of the load-lock chamber 3 is closed, and ambience replacement from atmosphere to reduced pressure He gas is carried out in the load-lock chamber 3. As a reduced pressure He ambience, substantially of the same pressure as the chamber 2 is established inside the load-lock chamber 3, and the chamber side gate valve 6 is opened. The chamber inside conveying means 7 moves its arm into the load-lock chamber 3 to pick up the wafer inside the load-lock chamber 3. The conveying means then transfers that wafer to the holding means of the process station. Then, when there is a wafer, having been processed, placed at the wafer stand-by station (not shown), the conveying means 7 receives such a wafer and conveys the same toward the load-lock chamber 3 from which a wafer has just previously been taken out. Also, at the process station, a process such as an exposure process is made to the wafer. Then, the thus processed wafer is transferred from the process station to the wafer stand-by station. Conveyance of a wafer into and out of the other load-lock chamber 3a is carried out in a similar manner.

As regards the unloading of a wafer having been processed, the chamber inside conveying means 7 receives a processed wafer from the wafer stand-by station, and moves it to the load-lock chamber 3 or 3a. At this time, the ambience inside the load-lock chamber 3 or 3a is checked. Since, in the load-lock chamber 3 or 3a from which a wafer has just been previously taken out, the ambience replacement has been accomplished from the atmosphere to the reduced pressure He gas such that a reduced pressure He ambience is kept therein, and the inside conveying means 7 directly conveys the wafer into the load-lock chamber 3 or 3a. In the load-lock chamber 3 or 3a having a processed wafer thus conveyed therein, the chamber side gate valve 6 or 6a is closed, and the ambience replacement is carried out. Thereafter, after checking that the atmosphere side gate valve 5 or 5a is open, the conveying means 8 takes the wafer out of the load-lock chamber 3 or 3a and moves it back to the wafer carrier 4.

While the wafer conveyance is made in accordance with the basic procedure described above, for improvements of throughput, it may be done in accordance with a conveyance sequence such as shown in FIG. 2. The sequence will be described in detail. In FIG. 2, denoted at 1 is a process station such as an exposure station, inside the chamber. Denoted at 3 and 3a are load-lock chambers, and denoted at 4 is a wafer carrier to be placed at the supply station in the atmosphere. Denoted at 7 and 8 are conveying means, and denoted at 9 is a wafer stand-by station where a wafer having been processed is kept temporarily. Arrows depict the state of wafer conveyance or wafer transfer. Mesh portions denote places where wafers are present. Here, it is assumed that, in a state wherein a wafer is present inside the load-lock chamber 3 or 3a, the ambience replacement thereof from a reduced pressure He to the atmosphere or from the atmosphere to the reduced pressure He gas has been accomplished.

First, at step S1, the conveying means 8 moves into the wafer carrier 8 placed in the atmosphere, and it picks up one wafer accommodated in the wafer carrier 4. The conveying means 8 grasping the wafer retracts its arm, and it checks the ambience inside the load-lock chamber 3 or 3a. Here, if the load-lock chamber 3 is filled with an atmospheric ambience, the conveying means 8 rotates its arm toward the load-lock chamber 3. After checking that the atmosphere side gate valve 5 is open, the conveying means 8 extends its arm to convey the wafer into the load-lock chamber 3. After the wafer is transferred into the load-lock chamber 3, the conveying means 8 retracts its arm and moves backwardly.

At step S2, the conveying means 8 moved out of the load-lock chamber 3 then enters the wafer carrier 4, and it takes a next wafer out of the carrier. It checks the states inside the load-lock chambers 3 and 3a, and enters the load-lock chamber 3a which is now vacant. Here, if the inside ambience of the load-lock chamber 3a is at the atmosphere, the conveying means enters it directly. If a He ambience is there, the ambience replacement to the atmospheric ambience is carried out and, thereafter, the conveying means enters the chamber. After the wafer is transferred into the load-lock chamber 3a, the conveying means 8 retracts its arm and moves backwardly. Here, in parallel to this operation, in the load-lock chamber 3, the atmosphere side gate valve 5 is closed and the ambience replacement from the atmosphere to He is carried out. In this manner, during a wafer conveyance operation to one load-lock chamber 3a, the ambience replacement of the other load-lock chamber 3 is accomplished so that a reduced pressure He ambience of substantially the same pressure as that in the chamber 2 is established in the load-lock chamber 3.

Subsequently, at step S3, the chamber side gate valve 6 of the load-lock chamber 3 is opened. The chamber inside conveying means 7 moves its arm into the load-lock chamber 3 to take the wafer in the load-lock chamber 3 out of the same. The wafer is then transferred to the holding means of the process station 1. During this operation, in the other load-lock chamber 3a, the atmosphere side gate valve 5a is closed, and the ambience replacement is carried out in the load-lock chamber 3a such that a reduced pressure He ambience of substantially the same pressure as that in the chamber 2 is accomplished in the load-lock chamber 3a.

Then, at step S4, the process (exposure process) of the wafer is carried out at the process station 1. Here, if there is an already processed wafer placed at the wafer stand-by station 9, the conveying means 7 collects the processed wafer at the stand-by station 9 and moves it to the load-lock chamber 3 wherein no wafer is placed (in the example of FIG. 2, at step S4, there is no processed wafer at the stand-by station 9). Further, since at this time the load-lock chamber 3 is in the state in which a wafer has been taken out therefrom, the inside ambience thereof is replaced from the He ambience to the atmosphere, in preparation for introduction of a subsequent wafer.

At step S5, a wafer to which the process at the process station 1 has been completed is transferred to the stand-by station 9 by the holding means of the process station 1. Simultaneously therewith, the conveying means 8 moves into the wafer carrier 4 to pick up a next wafer It moves the wafer into the load-lock chamber 3 whose ambience has been replaced by an atmospheric ambience.

At step S6, in the load-lock chamber 3a having its inside ambience replaced by a reduced pressure He ambience of approximately the same pressure as that of the chamber 2, the chamber side gate valve 6a is opened. The chamber inside conveying means 7 enters the load-lock chamber 3a, and it takes the wafer out of the chamber and transfers the same to the holding means of the process station 1. Simultaneously therewith, in the load-lock chamber 3, the atmosphere side gate valve 5 is closed and the ambience replacement is carried out, whereby a reduced pressure He ambience is established therein.

At step S7, the process of the wafer is carried out at the process station 1. Simultaneously therewith, the conveying means 7 having conveyed a wafer from the load-lock chamber 3a to the holding means of the process station 1, promptly rotates toward the stand-by station 9 to receive the processed wafer placed at the stand-by station 9. The conveying means 7 then conveys the wafer to the load-lock chamber 3a from which a wafer has just previously been taken out.

At step S8, the wafer having been processed at the process station 1 is transferred to the stand-by station 9 from the holding means of the process station. Here, in the load-lock chamber 3a, the ambience replacement from He to atmosphere is carried out after the processed wafer is introduced therein.

At step S9, in the load-lock chamber having a reduced pressure He ambience of approximately the same pressure as that in the chamber 2 established therein, the chamber side gate valve 6 is opened. The conveying means 7 then moves into the load-lock chamber 3, and it takes the wafer out of the chamber and transfers the same to the holding means of the process station. Simultaneously therewith, the conveying means 8 takes the processed wafer from the load-lock chamber 3a having its ambience replaced from He to atmosphere, and moves it back to the wafer carrier 4. Then, at step S10, the chamber inside conveying means 7 rotates toward the stand-by station 9 and receives the processed wafer placed at the stand-by station 9. The conveying means 7 then moves it to t he load-lock chamber 3 from which a wafer has just previously been taken out. Simultaneously therewith, the conveying means 8 having moved the processed wafer back to the wafer carrier 4, takes a next (unprocessed) wafer out of the wafer carrier 4 and moves it to the load-lock chamber 3 from which a wafer has just previously been taken out. Also, at this moment, the wafer process is carried out at the process station 1.

At step S11, the wafer having been processed at the process station 1 is transferred to the stand-by station 9 from the holding means of the process station 1. Here, in the load-lock chamber 3, after the processed wafer is introduced therein, the ambience replacement from He to atmosphere is carried out. Also, in the load-lock chamber 3a, the ambience replacement to a reduced pressure He ambience is performed.

At step S12, the conveying means 8 takes the processed wafer out of the load-lock chamber 3 having its inside ambience replaced from He to atmosphere, and it moves the wafer back to the wafer carrier 4. Simultaneously therewith, in the load-lock chamber 3a having a reduced pressure He ambience of approximately the same pressure as that of the chamber 2 established therein, the chamber side gate valve 6a is opened. The conveying means 7 then takes the wafer out of the load-lock chamber 3a, and it transfers the same to the holding means of the process station 1.

At step S13, the process of the wafer is carried out at the process station 1. The conveying means 7 rotates toward the stand-by station 9, and it receives a processed water kept at the stand-by station 9 and moves the same to the load-lock chamber 3a from which a wafer has just previously been taken out. Simultaneously therewith, the conveying means 8 having the processed wafer moved back to the water carrier 4, takes a next wafer out of the wafer carrier 4, and it moves the same to the load-lock chamber 3 from which a wafer has just previously been taken out.

Thereafter, the sequence goes back to step S8 and, through similar operations, wafer processes and wafer conveyance operations are made to wafers of a predetermined number.

In accordance with this embodiment of the present invention, as described hereinbefore, the chamber inside conveying means 7 functions to take a wafer out of the load-lock chambers 3 and 3a having their inside ambience replaced by He ambience, and to move the same to the process station 1. If there is a wafer, having been processed, at the wafer stand-by station 9, the processed wafer is collected from the chamber 3 or 3a from which a wafer has just previously been taken out. Here, the load-lock chamber 3 or 3a from which a wafer has just been taken out is kept at the same state as the wafer is taken out therefrom, namely, it is kept with a reduced pressure He ambience, and the collected wafer can be promptly moved into that load-lock chamber 3 or 3a. Further, if the ambience replacement of the load-lock chamber 3 or 3a to He gas is completed and there is no wafer at the process station 1, the conveying means 7 inside the chamber promptly operates to take the wafer out of the load-lock chamber 3 or 3a and moves the same to the process station 1. Also, after the wafer is processed at the process station 1 and is transferred to the stand-by station 9, the conveying means 7 promptly operates to move another wafer to the process station 1.

The conveying means 8 functions to supply a wafer to the load-lock chamber 3 or 3a kept with an atmospheric inside ambience. Additionally, as the ambience replacement of the load-lock chamber 3 or 3a is completed after a processed wafer is moved back to the load-lock chamber, the conveying means 8 operates to take the wafer out of the chamber and moves the same back to the wafer carrier 4. Further, it takes a next wafer out of the wafer carrier 4, and conveys the same to the load-lock chamber 3 or 3a from which a wafer has just previously been taken out.

In the manner as described above, plural load-lock chambers are used alternately. Additionally, a wafer is conveyed into such a load-lock chamber from which a wafer has just previously been taken out. In each load-lock chamber, both the wafer conveyance into and out of the same is carried out, being accompanied by ambience replacement. With this structure, it is assured that the ambience replacement is not carried out when there is no wafer. The wafer conveyance time, including the load-lock chamber ambience replacement time, can be best shortened. As regards the process station, there is no useless time in which a wafer process is not carried out. Thus, efficient wafer processing is assured and, therefore, the throughput can be improved significantly.

Next, an embodiment of a semiconductor device manufacturing method which uses a substrate processing system of the present invention such as described above, will be explained.

Figure 7:
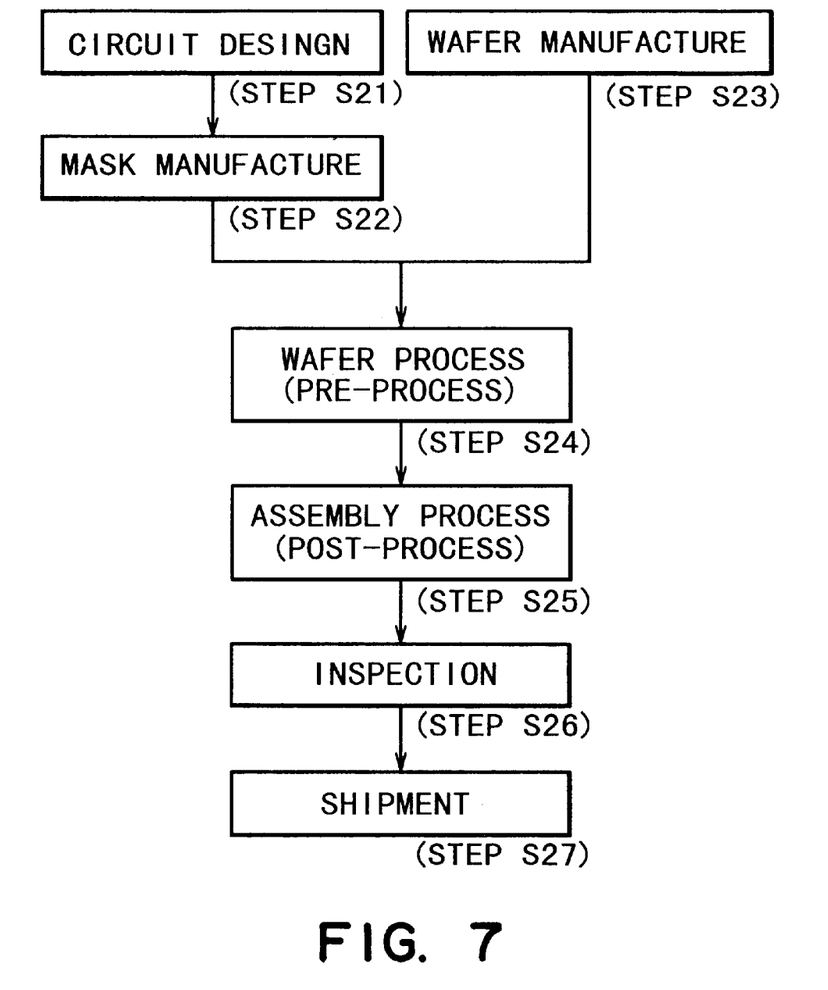
FIG. 7 is a flow chart of semiconductor device manufacturing processes.

FIG. 7 is a flow chart of a procedure for the manufacture of microdevices such as semiconductor chips (e.g., ICs or LSIs), liquid crystal panels, CCDs, thin film magnetic heads or micro-machines, for example.

Step S21 is a design process for designing a circuit of a semiconductor device. Step S22 is a process for making a mask on the basis of the circuit pattern design. Step S23 is a process for preparing a wafer by using a material such as silicon. Step S24 is a wafer process (called a pre-process) wherein, by using the so prepared mask and wafer, circuits are practically formed on the wafer through lithography. Step S25 subsequent to this is an assembling step (called a post-process) wherein the wafer having been processed by step S24 is formed into semiconductor chips. This step includes an assembling (dicing and bonding) process and a packaging (chip sealing) process. Step S26 is an inspection step wherein an operation check, a durability check and so on for the semiconductor devices provided by step S25, are carried out. With these processes, semiconductor devices are completed and they are shipped (step S27).

Figure 8:
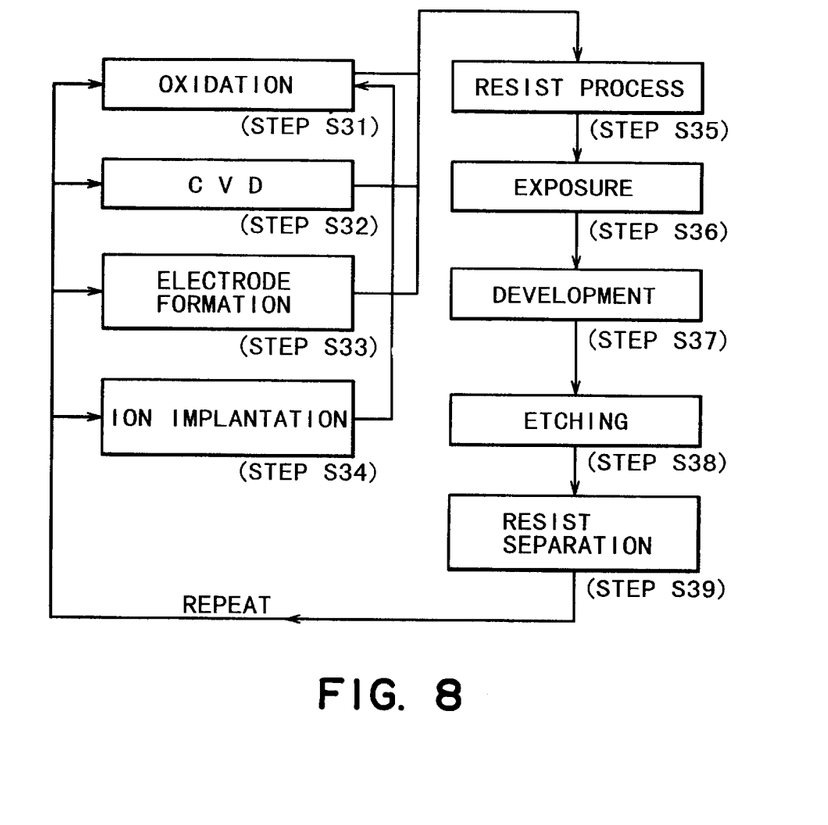
FIG. 8 is a flow chart for explaining details of a wafer process included in the procedure of FIG. 7.

FIG. 8 is a flow chart showing details of the wafer process.

Step S31 is an oxidation process for oxidizing the surface of a wafer. Step S32 is a CVD process for forming an insulating film on the wafer surface. Step S33 is an electrode forming process for forming electrodes upon the wafer by vapor deposition. Step S34 is an ion implanting process for implanting ions to the wafer. Step S35 is a resist process for applying a resist (photosensitive material) to the wafer. Step S36 is an exposure process for printing, by exposure, the circuit pattern of the mask on the wafer through the exposure apparatus described above. Step S37 is a developing process for developing the exposed wafer. Step S38 is an etching process for removing portions other than the developed resist image. Step S39 is a resist separation process for separating the resist material remaining on the wafer after being subjected to the etching process. By repeating these processes, circuit patterns are superposedly formed on the wafer.

With these processes, high density microdevices can be manufactured.

In accordance with the present invention as described hereinbefore, plural load-lock chambers are used, and in each load-lock chamber, the wafer conveyances into the chamber and out of the chamber are performed alternately. Further, a substrate to be processed is introduced into a load-lock chamber from which a substrate has just previously been taken out. The wafer conveyances into and out of the load-lock chambers are both carried out, and thereafter, the ambience replacement is performed. This assures that the ambience replacement is not executed in a state where there is no substrate. The substrate conveyance time including load-lock chamber ambience replacement time can be made shortest. Further, there is no useful time in which a process is not performed at the process station. The efficient substrate processing is thus accomplished, and the throughput can be enlarged significantly.

While the invention has been described with reference to the structures disclosed herein, it is not confined to the details set forth and this application is intended to cover such modifications or changes as may come within the purposes of the improvements or the scope of the following claims.

What is claimed is:

1. A substrate processing system comprising:

a process chamber having a process station for performing a predetermined process to a substrate in a predetermined ambience;

first and second load-lock chambers for receiving an unprocessed substrate from outside of said process chamber and subsequently, after replacement with the predetermined ambience, transferring the unprocessed substrate into an inside of said process chamber, said first and second load-lock chambers further being operable to receive a processed substrate from the inside of said process chamber in a state being replaced with the predetermined ambience, and subsequently to transfer the processed substrate to the outside of said process chamber;

a first conveying device for performing substrate conveyance between said first load-lock chamber and said process station and between said second load-lock chamber and said process station; and a second conveying device for performing substrate conveyance between said first load-lock chamber and the outside of said process chamber and between said second load-lock chamber and the outside of said process chamber, wherein said first conveying device operates to transfer the processed substrate to one of said first and second load-lock chambers, being replaced with the predetermined ambience, on the basis of a detection result made with respect to ambiences of said first and second load-lock chambers, respectively, and wherein said second conveying device operates to transfer the unprocessed substrate to one of said first and second load-lock chambers, having an ambience approximately equivalent to that of the outside of said process chamber, on the basis of a detection result made with respect to ambiences of said first and second load-lock chambers, respectively.

2. A substrate processing system according to claim 1, wherein, during substrate reception or substrate transfer in one of said first and second load lock chambers, replacement with the predetermined ambience is carried out in the other load-lock chamber.

3. A substrate processing system according to claim 1, wherein said first and second load-lock chambers are arranged so that, after the processed substrate is received from the inside of said process chamber in the state being replaced with the predetermined ambience, replacement with the ambience approximately equivalent to the ambience of the outside of said process chamber is carried out and that the processed substrate is subsequently transferred to the outside of said process chamber.

4. An exposure processing system comprising:

a process chamber having a process station for performing an exposure process to a substrate by use of X-rays, in a reduced pressure helium ambience;

first and second load-lock chambers for receiving an unprocessed substrate from an outside of said process chamber and subsequently, after replacement with the reduced pressure helium ambience, transferring the unprocessed substrate into an inside of said process chamber, said first and second load-lock chambers further being operable to receive a processed substrate from the inside of said process chamber in a state being replaced with the reduced pressure helium ambience, and subsequently to transfer the processed substrate to the outside of said process chamber;

a first conveying device for performing substrate conveyance between said first load-lock chamber and said process station and between said second load-lock chamber and said process station; and a second conveying device for performing substrate conveyance between said first load-lock chamber and the outside of said process chamber and between said second load-lock chamber and the outside of said process chamber, wherein said first conveying device operates to transfer the processed substrate to one of said first and second load-lock chambers, being replaced with the reduced pressure helium ambience, on the basis of a detection result made with respect to ambiences of said first and second load-lock chambers, respectively, and wherein said second conveying device operates to transfer the unprocessed substrate to one of said first and second load-lock chambers, having an ambience approximately equivalent to that of the outside of said process chamber, on the basis of a detection result made with respect to ambiences of said first and second load-lock chambers, respectively.

5. A substrate conveying system for conveying a substrate to a process chamber having a process station for performing a predetermined process to a substrate, in a predetermined ambience, said substrate conveying system comprising:

first and second load-lock chambers for receiving an unprocessed substrate from outside of said process chamber and subsequently, after replacement with the predetermined ambience, transferring the unprocessed substrate into an inside of said process chamber, said first and second load-lock chambers further being operable to receive a processed substrate from the inside of said process chamber in a state being replaced with the predetermined ambience, and subsequently, to transfer the processed substrate to the outside of said process chamber;

a first conveying device for performing substrate conveyance between said first load-lock chamber and said process station and between said second load-lock chamber and said process station; and a second conveying device for performing substrate conveyance between said first load-lock chamber and the outside of said process chamber and between said second load-lock chamber and the outside of said process chamber, wherein said first conveying device operates to transfer the processed substrate to one of said first and second load-lock chambers, being replaced with the predetermined ambience, on the basis of a detection result made with respect to ambiences of said first and second load-lock chambers, respectively, and wherein said second conveying device operates to transfer the unprocessed substrate to one of said first and second load-lock chambers, having an ambience approximately equivalent to that of the outside of said process chamber, on the basis of a detection result made with respect to ambiences of said first and second load-lock chambers, respectively.

6. A device manufacturing method, comprising the steps of:

providing a substrate in an atmospheric ambience;

inspecting ambiences of two load-lock chambers, respectively, and conveying, on the basis of a result of the inspection, the substrate to one of the two load-lock chambers, having an ambience approximately equivalent to the atmospheric ambience;

replacing the atmospheric ambience in an inside of the load-lock chamber, having the substrate conveyed thereinto, with a predetermined ambience;

conveying the substrate from the load-lock chamber being replaced with the predetermined ambience, to a process chamber having the predetermined ambience maintained therein;

performing an exposure process to the substrate conveyed, in the process chamber having the predetermined ambience maintained therein;

inspecting ambiences of the two load-lock chambers, respectively, and conveying, on the basis of a result of the inspection, the exposure-processed substrate to one of the two load-lock chambers, having an ambience approximately equivalent to the predetermined ambience;

conveying the exposure-processed substrate from the load-lock chamber having the substrate conveyed thereinto, to the atmospheric ambience; and developing the exposure-processed substrate.

* * * * *

UNITED STATES PATENT AND TRADEMARK OFFICE
CERTIFICATE OF CORRECTION

PATENT NO. : 6,805,748 B1
DATED : October 19, 2004
INVENTOR(S) : Ryo Edo

It is certified that error appears in the above-identified patent and that said Letters Patent is hereby corrected as shown below:

Drawings,
Sheet 7 of 8, FIG. 7, in "(STEP S21)," "DESINGN" should read -- DESIGN --.

Column 1,
Line 14, "in" should read -- a --.
Line 19, "linewidth" should read -- line width --.

Column 2,
Line 12, "water" should read -- wafer --.
Line 55, "carrier 24" should read -- carrier 204 --.
Line 64, "open to" should read -- open such that the chamber 203 is open to --.

Column 4,
Line 1, "FIG. 5." should read -- FIG. 5, --.
Line 6, "water" should read -- wafer --.
Line 9, "illustrates" should read -- illustrate --.
Line 28, "step S510," should read -- step S105, --.
Line 45, "ch mber" should read -- chamber --.
Line 55, "Out" should read -- out --.
Line 65, "and." should read -- and, --.

Column 5,
Line 2, "mean:s" should read -- means --.
Line 16, "form" should read -- from --.
Line 48, "illustrates" should read -- illustrate --.
Line 58, "chamber 103" should read -- chamber 203 --.

Column 6,
Line 17, "by load-lock" should read -- by the conveying means 207, while in the sending out load-lock --.

Column 7,
Line 31, "it" should read -- a --.
Line 32, "to" should read -- may --.
Line 60, "t)he" should read -- the --.

UNITED STATES PATENT AND TRADEMARK OFFICE
CERTIFICATE OF CORRECTION

PATENT NO.    : 6,805,748 B1
DATED         : October 19, 2004
INVENTOR(S)   : Ryo Edo It is certified that error appears in the above-identified patent and that said Letters Patent is hereby corrected as shown below:

Column 8,
Line 20, "water" should read -- wafer --.
Line 36, "according an" should read -- according to an --.
Line 37, "as" should read -- is --.
Line 38, "In" should read -- in --.
Line 46, "placed" should read -- placed. --.

Column 9,
Line 30, "wafers" should read -- wafers. --.
Line 54, "pressure" should read -- pressure, -- and "ambience," should read -- ambience --.

Column 11,
Line 32, "wafer" should read -- wafer. --.
Line 61, "chamber having" should read -- chamber 3 having --.

Column 12,
Line 8, "t he" should read -- the --.
Lines 35 and 40, "water" should read -- wafer --.
Line 56, "the chamber" should read -- the stand-by station 9 and moved into the load-lock chamber --.

Signed and Sealed this

Twenty-fifth Day of January, 2005

JON W. DUDAS
*Director of the United States Patent and Trademark Office*